United States Patent
Luu

(10) Patent No.: US 9,166,611 B2
(45) Date of Patent: Oct. 20, 2015

(54) EFFICIENT HIGH SPEED ADC INTERFACE DESIGN

(71) Applicant: Raytheon Company, Waltham, MA (US)

(72) Inventor: Howard K. Luu, Temple City, CA (US)

(73) Assignee: Raytheon Company, Waltham, MA (US)

( * ) Notice: Subject to any disclaimer, the term of this patent is extended or adjusted under 35 U.S.C. 154(b) by 30 days.

(21) Appl. No.: 14/011,556

(22) Filed: Aug. 27, 2013

(65) Prior Publication Data

US 2015/0061906 A1 Mar. 5, 2015

(51) Int. Cl.
| | |
|---|---|
| H03M 1/00 | (2006.01) |
| H03M 1/12 | (2006.01) |
| H03M 9/00 | (2006.01) |
| H04L 25/03 | (2006.01) |
| H04L 25/14 | (2006.01) |

(52) U.S. Cl.
CPC .............. *H03M 1/1205* (2013.01); *H03M 9/00* (2013.01); *H04L 25/03872* (2013.01); *H04L 25/14* (2013.01)

(58) Field of Classification Search
CPC ........................................................ H03M 9/00
USPC .......... 341/122, 155, 100; 370/206, 392, 389, 370/479, 465
See application file for complete search history.

(56) References Cited

U.S. PATENT DOCUMENTS

| | | | | |
|---|---|---|---|---|
| 5,357,249 A | * | 10/1994 | Azaren et al. ................. | 341/100 |
| 6,148,320 A | * | 11/2000 | Katznelson ................... | 380/206 |
| 6,618,395 B1 | | 9/2003 | Kimmitt | |
| 7,170,891 B2 | * | 1/2007 | Messenger .................... | 370/392 |
| 2002/0174368 A1 | | 11/2002 | Nishizaki | |
| 2005/0047512 A1 | * | 3/2005 | Neff et al. ..................... | 375/259 |
| 2007/0002893 A1 | * | 1/2007 | Neff et al. ..................... | 370/465 |
| 2007/0115974 A1 | * | 5/2007 | Messenger .................... | 370/389 |
| 2007/0206643 A1 | * | 9/2007 | Egan et al. .................... | 370/479 |
| 2011/0299688 A1 | * | 12/2011 | Ostrem et al. ................ | 380/287 |

OTHER PUBLICATIONS

Notification of Transmittal of the International Search Report and The Written Opinion of the International Searching Authority, or the Declaration dated Oct. 21, 2014 in connection with International Patent Application No. PCT/US2014/044075.

* cited by examiner

Primary Examiner — Jean B Jeanglaude

(57) ABSTRACT

A system can include a first section with an ultra high speed digital sampler configured to sample at a first rate, a scrambler connected to the sampler, and a set of ultra high speed serial data outputs. The system can further include a second section with a set of ultra high speed serial data inputs, a set of serial to parallel converter circuits connected to the inputs and outputting data at a second rate, a descrambler having inputs connected to the reduced speed data outputs, and a set of parallel outputs configured to output the serial data. The set of ultra high speed serial data outputs of the first section are configured to be connected to the set of ultra high speed serial data inputs in the second section by a set of ultra high speed communication pathways clocked at a speed substantially equal to the first rate.

21 Claims, 9 Drawing Sheets

US 9,166,611 B2

EFFICIENT HIGH SPEED ADC INTERFACE DESIGN

TECHNICAL FIELD

The present disclosure is directed in general to electronic analog to digital converters and more specifically to interface circuitry associated with ultra high speed analog to digital converters.

BACKGROUND OF THE DISCLOSURE

A variety of ultra high sample rate analog to digital converter (ADC) configurations are known. However, some of these include components that unnecessarily increase the size and complexity of particular configurations. For example, in ultra high sample rate ADC applications taking samples in the 1-10 gigahertz range, for example, above 3 GHz, interface connections for transmitting the data from a sampling location to a processing location has required complicated serializing and framing circuitry. Further, some ultra high sample rate ADC configurations have unacceptable pin counts, power consumption, data latency, silicon area, high non-recurring engineering costs, and other costs.

SUMMARY OF THE DISCLOSURE

To address one or more of the above-deficiencies of the prior art, one embodiment described in this disclosure provides a system comprising a first section comprising an ultra high speed digital sampler configured to output samples at a first rate, a set of parallel scramblers connected to the output lines of the sampler, each scrambler having an ultra high speed serial data output. The system further includes a second section comprising: a set of ultra high speed serial data inputs, a parallel set of serial to parallel converter circuits connected to the inputs and outputting data at a second rate, a set of parallel descramblers having inputs connected to the reduced speed data outputs, and a set of parallel outputs configured to output the sample data, wherein the set of ultra high speed serial data outputs of the first section are configured to be connected to the set of ultra high speed serial data inputs in the second section by a set of ultra high speed communication pathways clocked at a speed substantially equal to the first rate.

One embodiment described in this disclosure provides a system, comprising an analog to digital converter (ADC) system chip comprising an ultra high speed ADC converter having a plurality of digital output bit lines for each analog sample, a plurality of scramblers having input lines connected to the digital output bit lines of the ADC, the scramblers having a plurality of scramble output bit lines, a first multiplexer connected to the plurality of scramble output bit lines, an odd/even parity generator connected to the output of the multiplexer, a framing controller connected to the first multiplexer and the odd/even parity generator; and a second multiplexer connected to the output of the parity generator and first multiplexer. The system further comprises a field programmable gate array (FPGA) chip configured with a first clock data recovery (CDR) circuit having an input connected to the scrambler output of the second multiplexer on the ADC, and having an output, a plurality of additional clock data recovery (CDR) circuits, each additional CDR having an input connected to an outputs from the ADC chip, each CDR having an output. The system in this embodiment further comprises a plurality of serial input to parallel output (SIPO) circuits, each SIPO circuit having an input connected to the output of one of the CDR circuits, each SIPO circuit having an output, a deskew controller having a plurality of inputs connected to the outputs of the plurality of SIPO circuits, and a plurality of parallel descramble circuits connected to outputs of a plurality of the SIPO circuits.

One embodiment described in this disclosure provides a method of sampling an analog signal with an analog to digital converter (ADC) on a first semiconductor chip at a first sample rate to create digital samples in a data sample stream, wherein each digital sample has n bits. The method further includes scrambling each digital sample in the data sample stream, transmitting the data sample stream in parallel on n data lines at a bit rate equal to the first sample rate, receiving, on a second semiconductor chip, the data sample stream, converting the data sample stream to a scrambled parallel sample stream, the parallel sample stream having a second sample rate. The method further includes descrambling the scrambled parallel sample stream to create a descrambled parallel sample stream.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

Embodiments in this disclosure relate to an efficient implementation for a high sample rate ADC to interface with a receiver chip such as a Field Programmable Gate Array (FPGA). In some embodiments, no data demultiplexer (demux) is used to lower input/output data rates, leading to a decreased pin count. In some embodiments, no complex serializer and deserializer (SERDES) is used on the ADC side. This can allow low complexity circuits which take a minimum amount of silicon area, and have lower power consumption. In some embodiments, data bits may be transferred from the ADC on channels running at the same clock rate as the ADC sample rate, which can avoid multiple clock domain issues. In some embodiments, one additional bit channel can help align data bits on the receiving side.

Figure 1:
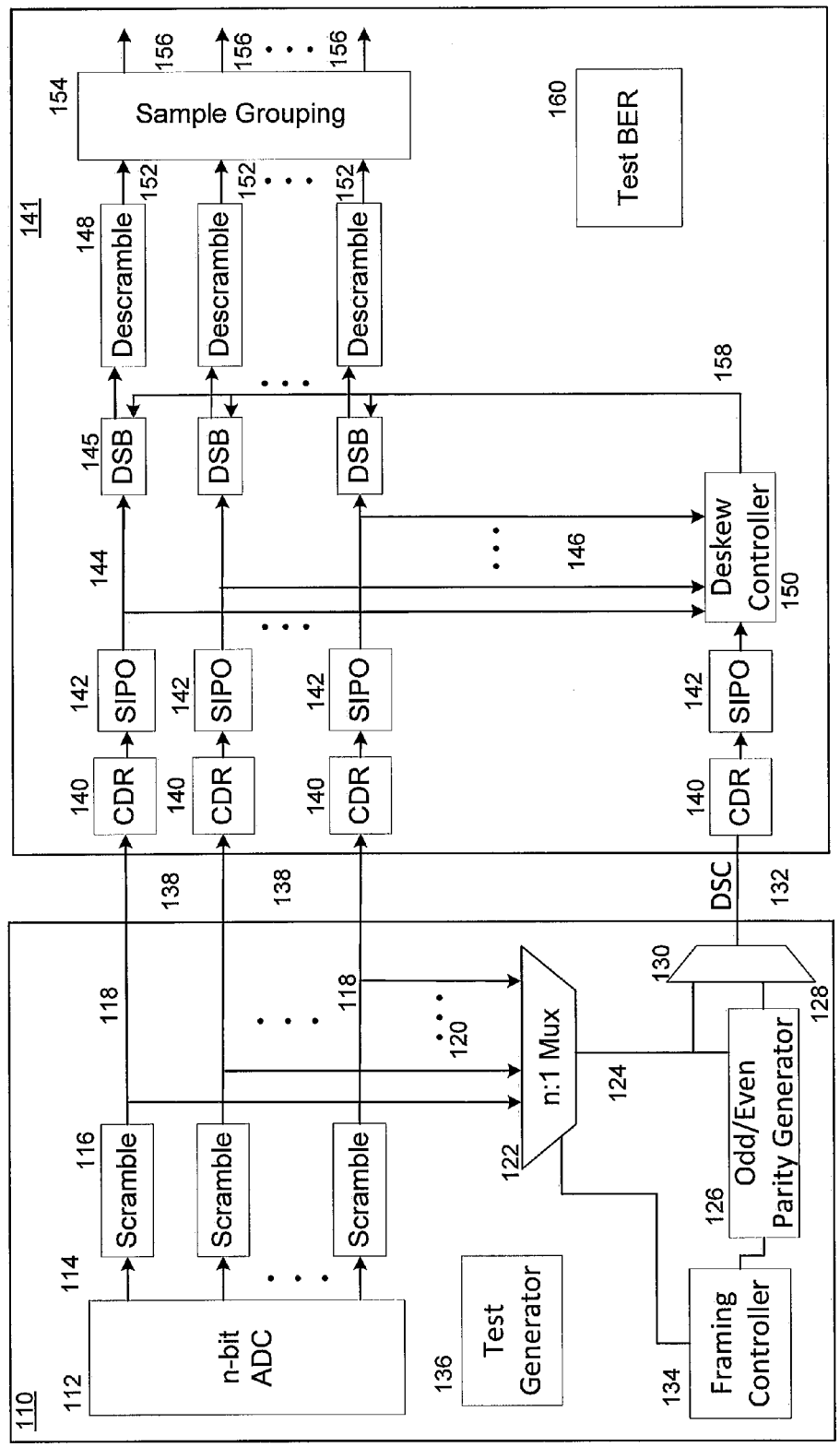
FIG. 1 illustrates an ultra high sample rate ADC circuit according to an embodiment of the present disclosure.

FIG. 1 illustrates an ultra high sample rate ADC system 100 according to an embodiment. FIG. 1 illustrates two sections 110 and 141, having bit lines 132, 138 running therebetween. Bitlines 132, 138 may be optical cables, special purpose wires, or other suitable serial connections between sections 110 and 141. Section 110 may be embodied as a special purpose ADC chip. Section 141 can be embodied as a general purpose Field Programmable Gate Array (FPGA), however, it could be designed in any suitable manner, such as an ASIC or separate components. In ADC section 110, an n-bit ADC produces samples at an ultra high rate, for example, in a gigahertz range such as 3.2 gigasamples per second. ADC 112 can sample with any suitable number of bits, with the understanding that increased numbers of bits allow increased bit precision, but require larger throughputs of data. Noise may render increased numbers of bits irrelevant. In one embodiment, n-bit ADC may sample at ten bits, allowing precision to approximately three significant decimals, while not creating an overly large stream of data. Each sample may be output from n-bit ADC 112 via n parallel bit lines 114. A scrambler circuit with n identical self-synchronizing scramblers 116 may receive each of the inputs 114, and output a scrambled version of the data on n scrambled data lines 118.

In this arrangement, data from n-bit ADC is scrambled to remove long strings of digital ones or digital zeros. In some embodiments, no further framing or processing of the data may be applied. In other words, data may be scrambled and output at the same rate as it is sampled by n-bit ADC 112. This approach avoids any complex circuitry which would be required to frame the data, serialize the data, and transmit the data at an appropriately high speed so that the sample rate for the ADC does not overwhelm the transmit circuitry. For example, with a ten-bit ADC sampling at 3.2 gigasamples per second means 32 Gbps. Transmitting this over one serial line can require complex SERDES circuits. Instead, the data may be transmitted over ten serial circuits with at 3.2 Gbps. Thus, the clocking domain of section 110 may be kept at 3.2 Ghz throughout.

To keep the data synchronized on the receiving end, an additional deskew channel DSC on line 132 may be used to assure that each of the n bit lines 138 is received properly in section 141. An n:1 multiplexer (mux) 122 has inputs 120 connected to each of the n scrambled data output lines 118. The n:1 mux output 124 is connected to an odd/even parity generator 126, and to a 2:1 mux 130. A framing controller 134 determines when the mux 122 outputs on line 124, and when the odd/even parity generator 126 outputs on line 128. The 2:1 mux 130 alternates between these outputs to produce DSC, which is detailed in FIG. 4.

In section 141, a set of ultra high speed clock data recovery (CDR) circuits 140 receive inputs from section 110. Each CDR circuit 140 may recover one channel from 110, including data channels sent over bit lines 138, and DSC sent over bit line 132. Each CDR 140 is connected to a serial in, parallel out (SIPO) circuit 142. SIPO circuits 142 take incoming serial bit data and convert it to a parallel form. SIPO circuits may convert the data to 32 bit parallel data, for example, and output this on scrambled parallel data lines 144. Once the data is converted to parallel form, it may be processed at a lower clock rate. If the parallel data is 32 bit, for example, then the 3.2 Gbps incoming data rate may be clocked down to 100 Mhz.

The scrambled parallel data lines 144 can form the inputs to a set of parallel deskew buffer (DSB) circuits 145. DSB circuits 145 can, in some embodiments, comprise shift registers and a multiplexer to independently select the delay for each bitstream among the n bitstreams to properly align data bits in the output digitized samples. A set of parallel descramble circuits 148 may be used to descramble the data on the scrambled parallel data lines 144, and output descrambled data samples at 152. The samples may be grouped by a sample grouping circuit 154. Following the 10-bit, 3.2 Gsps examples given above, sample grouping circuit 152 may output 32 10-bit samples at 100 Mhz on lines 156. This data may be output and used in any suitable fashion.

Scrambled parallel data lines 144 are also connected to a deskew controller 150 by lines 146. Deskew controller 150 can provide signals 158 to DSB circuits 145 to help deskew (align samples bit position) data. Signals 158 consist of bits value and position to check for bit alignment.

Section 110 may include a test generator 136 for generating known test data, in order to test the system 100. Section 141 may include a test bit error rate (BER) circuit 160 in order to evaluate the performance of system 141 by measuring a bit error rate when test generator is generating test data.

In alternative embodiments, one or more extra deskewing lines 132 may be used to aid in deskewing the data. In alternative embodiments, a set of n/2 2:1 multiplexers may be used to reduce the number of data lines 138. Of course, this requires a higher clocking rate. In some embodiments, section 141 may be embodied by a FPGA chip with high speed SERDES CDR circuits.

Figure 2:
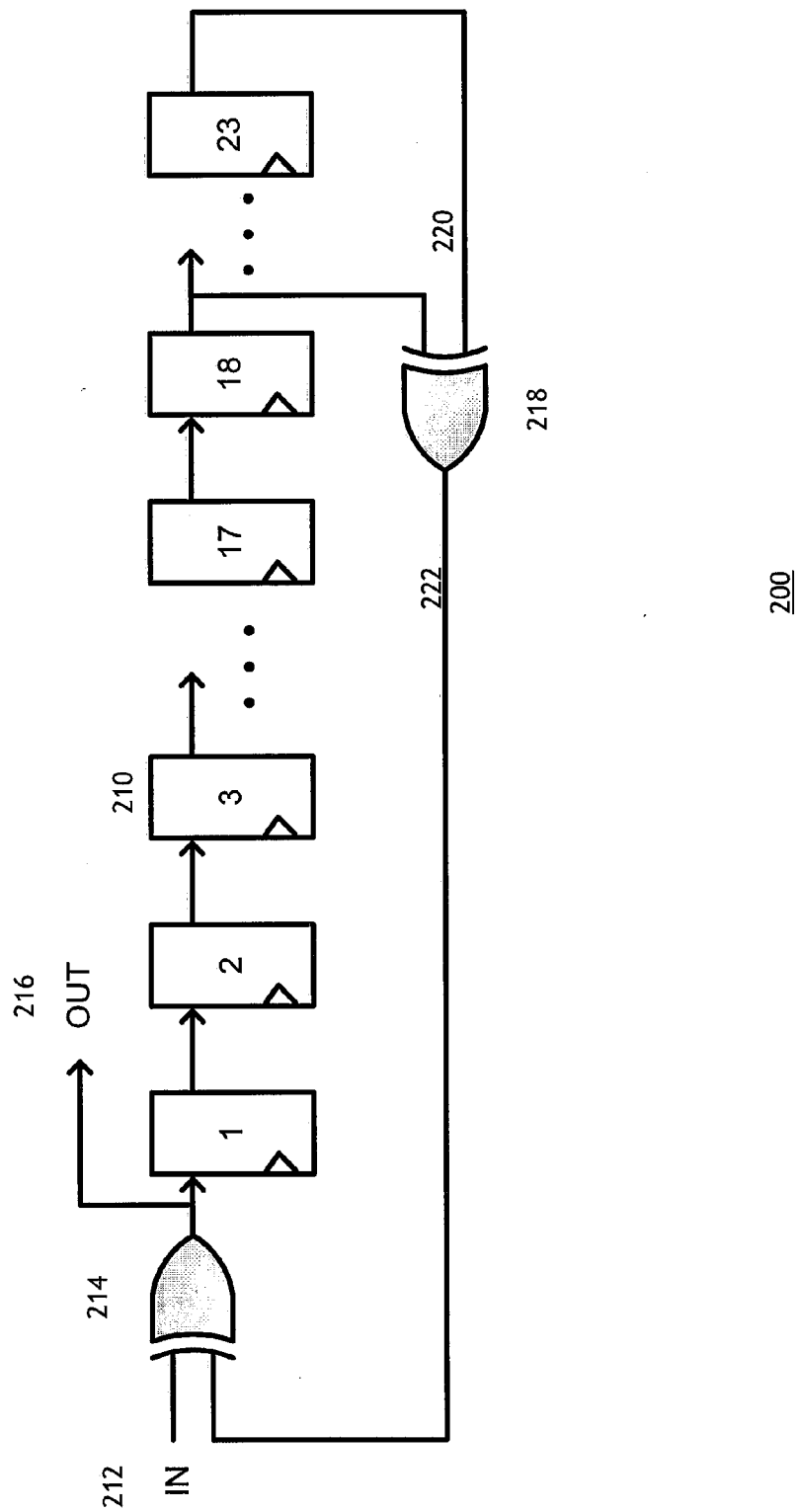
FIG. 2 illustrates a self-synchronizing scramble circuit according to an embodiment of the present disclosure.

FIG. 2 illustrates a self-synchronizing scramble circuit 200 according to an embodiment of the present disclosure. Self sychronizing scramble circuit 200 can also be called a multiplicative scrambler. Scramble circuit 200 can be used as part of scramble circuit 116 in section 110 shown in FIG. 1. In FIG. 2, a series of flip-flops 210 is illustrated which take data from an XOR gate 214. Data to first XOR gate 214 arrive at input 212 from one of the n parallel bit lines 114 shown in FIG. 1. Data is staged through the series of flip flops 210, illustrated in this example as 23 flip flops. A second XOR gate 218 may tap particular stages 220 of the series of flip flops 210 to produce an output 222 which is input into the first XOR gate 214. An output of the scrambler 200 is taken from the first XOR gate at 216. Output 216 is shown in FIG. 1 as one of the n scrambled data lines 118.

Figure 3:
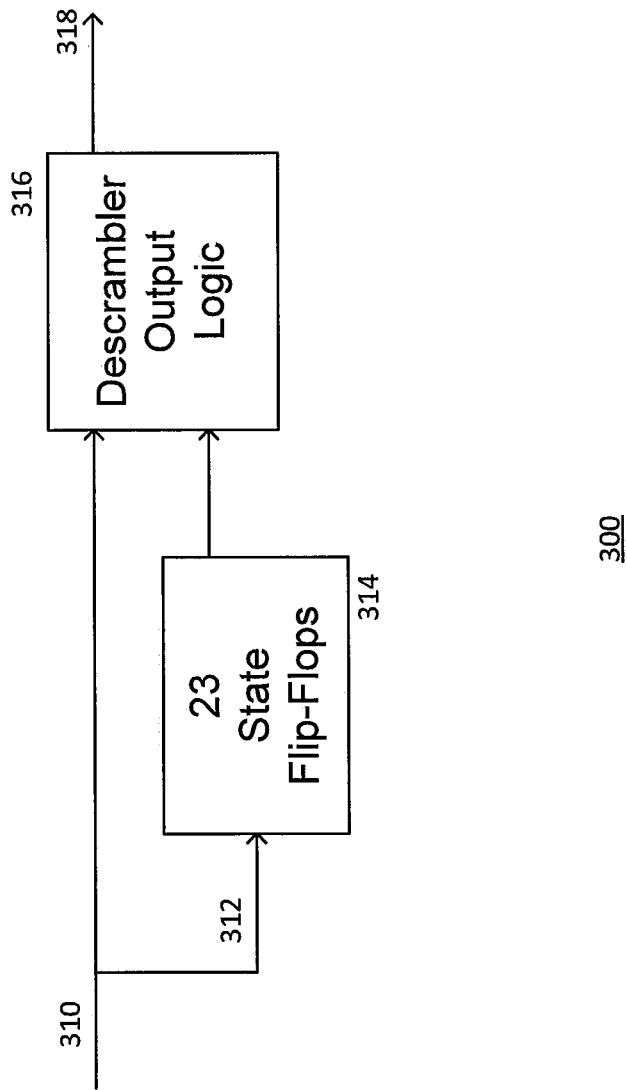
FIG. 3 illustrates a parallel implementation of a self-synchronizing descrambler 300 according to an embodiment of the present disclosure.

FIG. 3 illustrates a parallel implementation of a self-synchronizing descrambler 300 according to an embodiment of the present disclosure. The descrambler may consume 32 bits input on each clock cycle and update a 23 bit state series of flip flops as if it has run 32 times with 32 bits of input. The output 32 bits is a function of the 32 input bits, current state, and future states.

A parallel implementation of a descrambler 300 includes an input 310 of 32 bits, of which the 23 most significant bits are passed at input 312 to the 23 state flip-flop circuits 314. The input 310 is also passed, together with the output of 23 state flip flop circuit 314, to descrambler output logic circuit 316. The output of the descrambler output logic circuit 316 is 32 bits.

Figure 4:
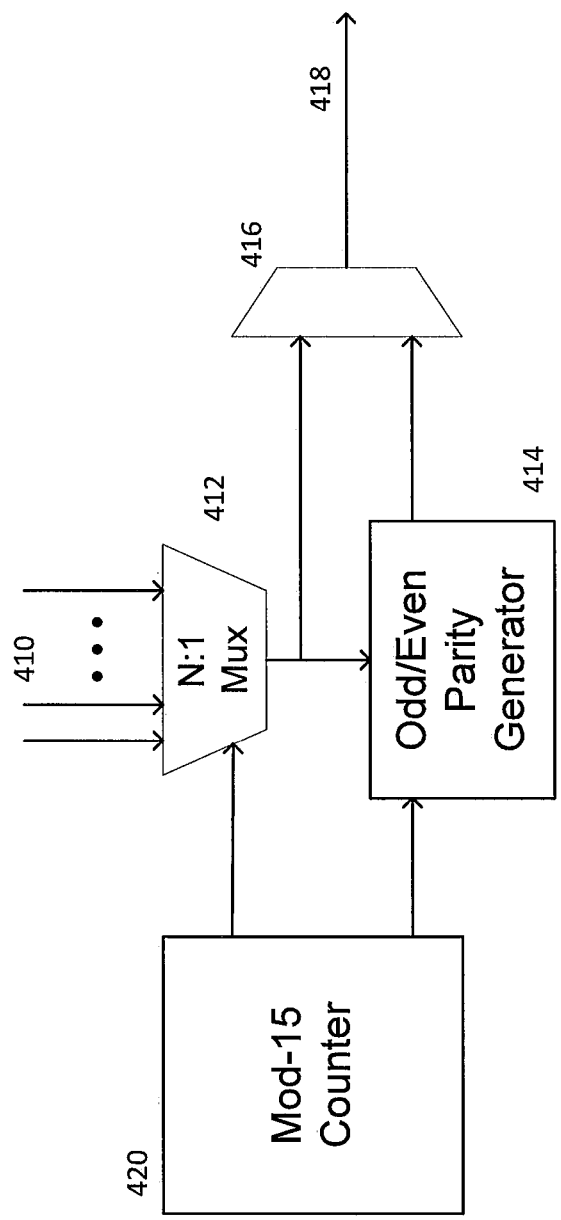
FIG. 4 illustrates a deskew channel generation circuit according to an embodiment of the present disclosure.

FIG. 4 illustrates a deskew channel generation circuit according to an embodiment of the present disclosure. The circuit is similar to the deskew circuit in section 110 of FIG. 1. Inputs 410 are similar to inputs 120 connected to each of the n scrambled data output lines 118 in FIG. 1. The output of n:1 mux 412 is connected both to an odd/even parity generator 414 and a 2:1 mux 416. The output of the 2:1 mux is a deskew channel DSC 418. The odd/even parity generator 414 is also connected to the 2:1 mux, and has an input from the Mod-15 counter 420. The Mod-15 counter controls whether the output to the 2:1 mux 416 is the N:1 mux 412 or the odd/even parity generator 414.

Figure 5:
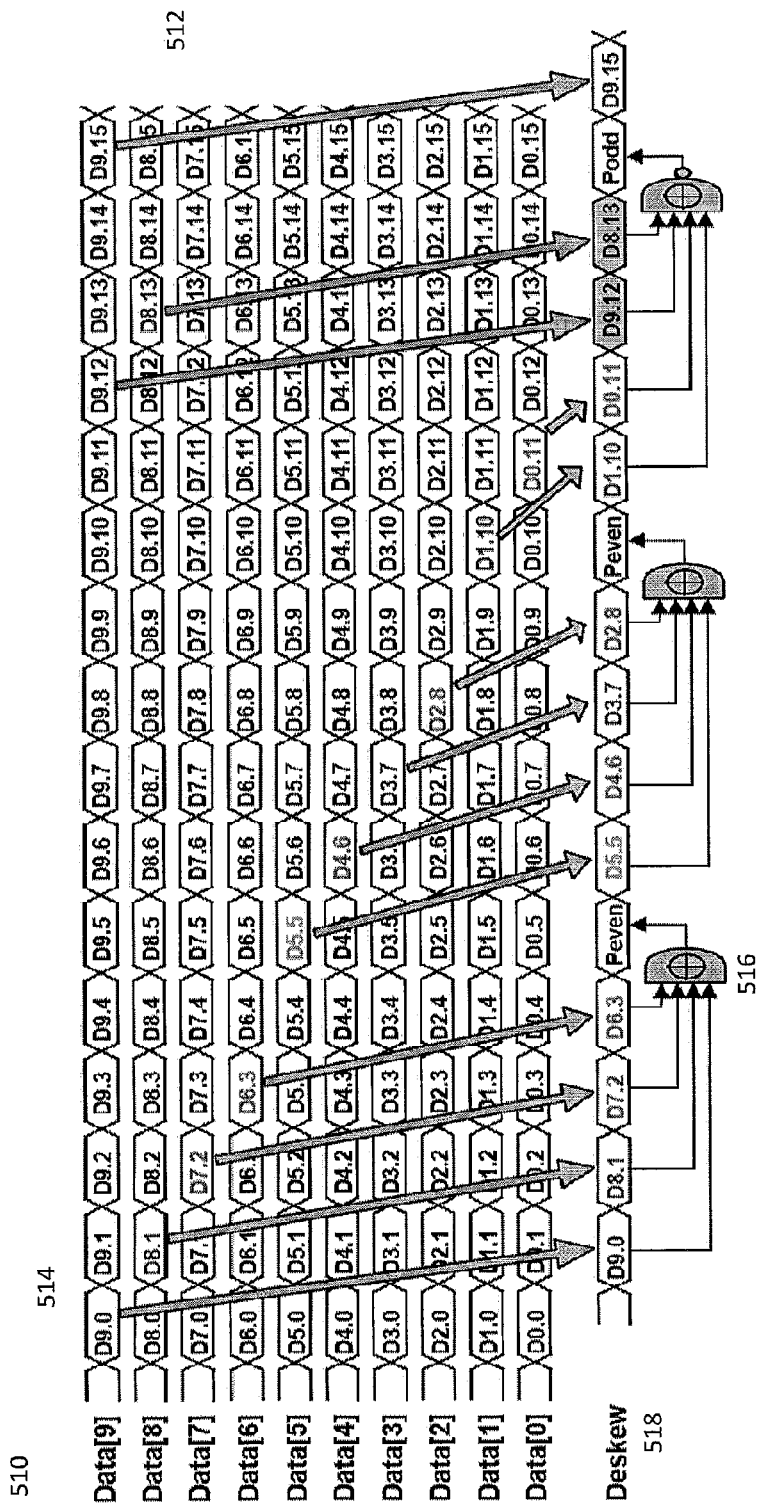
FIG. 5 illustrates a timing and data diagram of a deskew channel circuit input and output according to an embodiment of the present disclosure.

FIG. 5 illustrates a timing and data diagram of a deskew circuit input and output according to an embodiment of the present disclosure. In this figure, n=10, but n may also be other whole numbers may be used according to the sample size of an ADC. Each of the data inputs 510 to n:1 multiplexer has illustrated data timing diagrams 512. Arrows 514 show the mapping of individual bits from the data inputs 510 into the deskew channel DSC 518. One bit is chosen from each data input at different times for mapping into the DSC 518. An odd/even parity generator 516 produces parity bits at regular, predetermined intervals, to help create a recognizable pattern at the receiving end. As illustrated, the pattern for the DSC 518 is 4 bits from inputs 410, an even parity bit, 4 bits from inputs 410, another even parity bit, 4 more inputs from 410, and an odd parity bit. At this point, a cycle of fifteen bits is complete and the pattern repeats.

Figure 6:
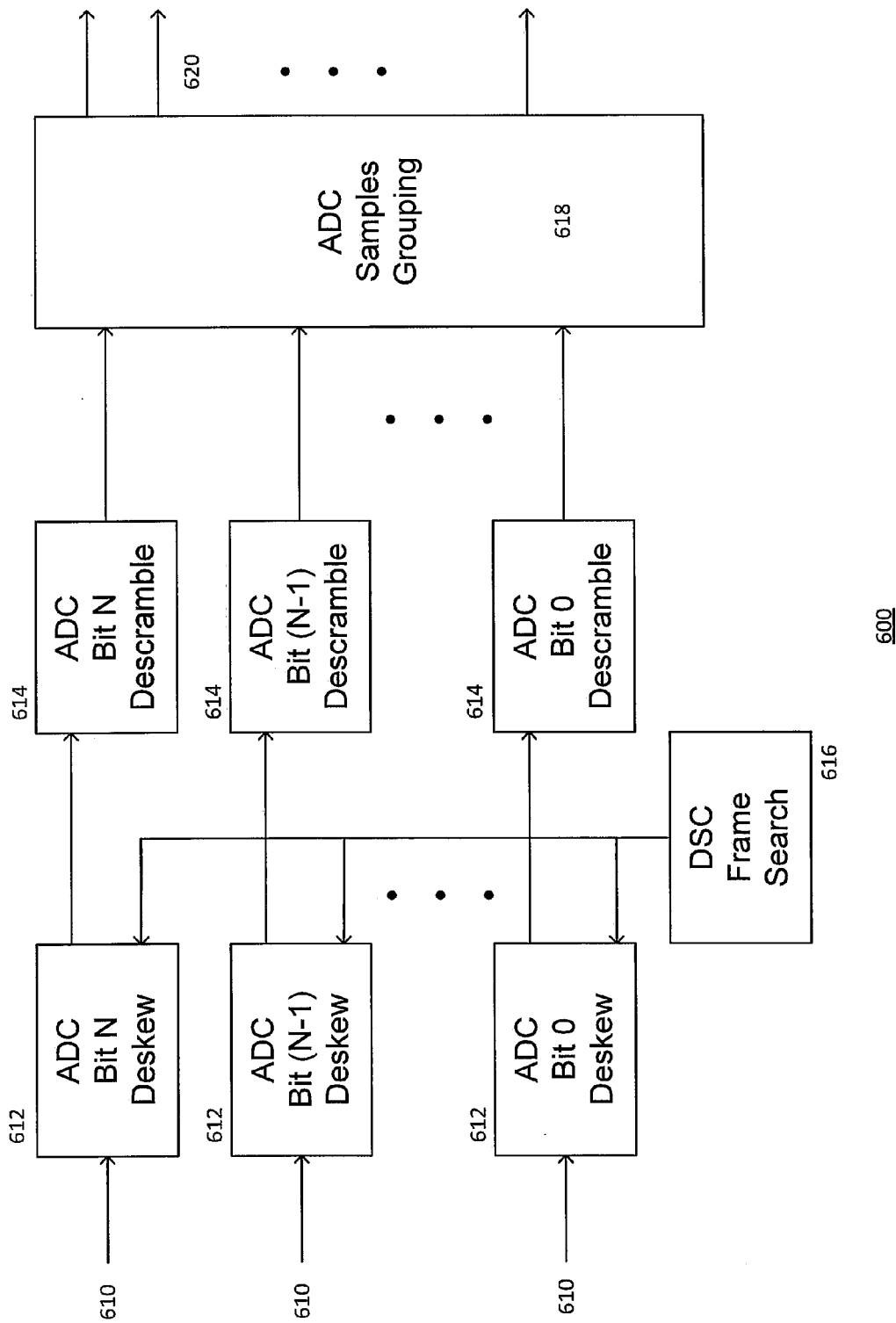
FIG. 6 illustrates a deskew, descramble and sample grouping circuit detail according to an embodiment of the present disclosure.

FIG. 6 illustrates a deskew, descramble and sample grouping circuit detail according to an embodiment of the present disclosure. Inputs 610 may be similar to inputs 144/146 from SIPO circuits 142 in FIG. 1. Each input 610 carries a bit stream deriving from one of the bit 0 to bit n in the sample stream created by an n-bit ADC. Inputs 610 feed into an ADC bit deskew circuit 612, which deskews the incoming bitstream with inputs from the DSC Frame Search circuit 616. Deskew circuits 612 are analogous to DSB circuits 145 in FIG. 1. Deskew circuits 612 in turn feed into ADC Descramble circuits 614, which serve to descramble the incoming bit stream. The ADC descramble circuits output the bitstreams to ADC Samples Grouping circuit 618, which groups bits from each input into reconstructed samples, and outputs the grouped samples on samples output lines 620.

Figure 7:
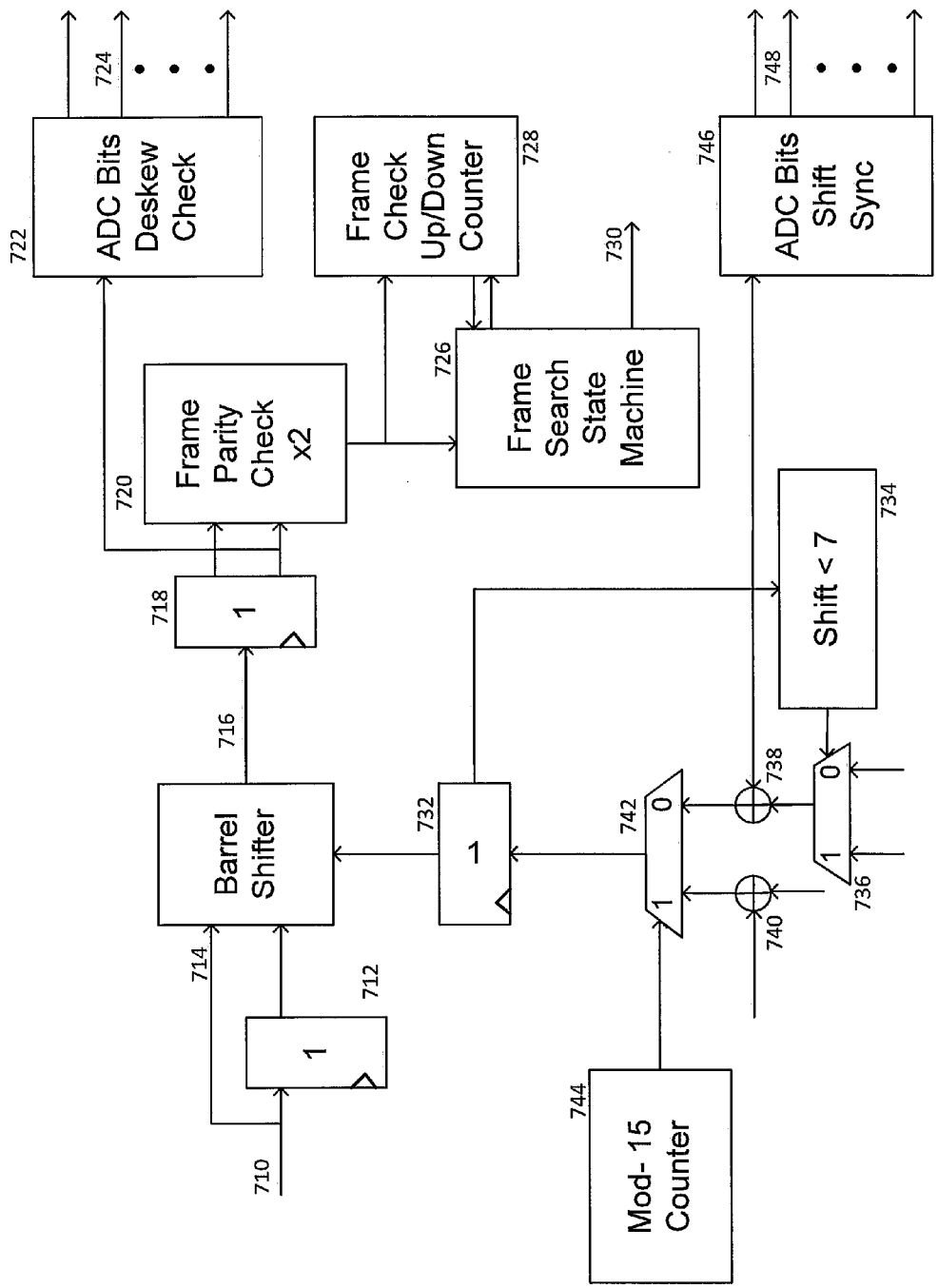
FIG. 7 illustrates a deskew channel frame search circuit according to an embodiment of the present disclosure.

FIG. 7 illustrates a deskew channel frame search circuit 700 according to an embodiment of the present disclosure. This circuit follows previous examples with n=10, for the sake of simplicity, but could be extended to any suitable number of bits. The logic structure of circuit 10 allows 2 hypothesis frames per clock cycle to check for a frame boundary using parity bits. A state machine is used to step through 15 potential hypotheses for a frame boundary. A frame check up/down counter improves the ratio of the probability of detection to the probability of false alarm. Circuit 700 outputs dynamic changing ADC data bits shift position on output lines 748, corresponding to zero skew, and data bits on output lines 724 to check if ADC data bits are aligned.

Circuit 700 can include DSC input 710, which can be a 32-bit input, for example. First flip flop 712 and barrel shifter 714 both receive the input, and Barrel Shifter 714 receives the output from first flip flop 712. Barrel shifter 714 can feed output, which can be 30 bits (to check 2 hypothesis frames every clock cycle), to second flip flop 718. Second flip flop 718 outputs 2 hypothesis 15-bit frame data to frame parity check ×2 circuit 720, as well as ADC Bits Deskew check circuit 722. ADC Bits Deskew check circuit 722 outputs two bits for each of the n-bits in the sample size at outputs 724. Frame parity check ×2 circuit also outputs to frame search state machine 726 and frame check up/down counter 728. Frame search state machine 726 outputs four offset bits at 730.

The output of a third flip-flop 732 controls the barrel shifter 714, and a comparator circuit 734. For the example of a 15-bit frame and 32-bit SIPO, comparator circuit 734 compares the shift amount with 7. The comparator circuit 734 controls the output of a first 2:1 mux 736, which is configured to feed number 13 or −2 depending on the comparator output. First 2:1 mux outputs into adder 738, which adds current shift amount to either 13 or −2 to compute the next shift amount to get the next 2 frames of data on output 716. Output of flip-flop 732 also goes to ADC Bits shift synch 746. ADC Bits shift synch 746 will add a constant to the current shift amount to get n (for 10-bit ADC, n is 10) sets of 6-bits outputs 748. Adder 738 also outputs to a second 2:1 mux, which in turn controls the third flip-flop 732. Second 2:1 mux also has inputs from a second adder 740, which in turn receives offset input 730 from frame search state machine 726 and a constant "31". Mod 15 counter 744 controls the multiplexing of second 2:1 multiplexer 742.

Figure 8:
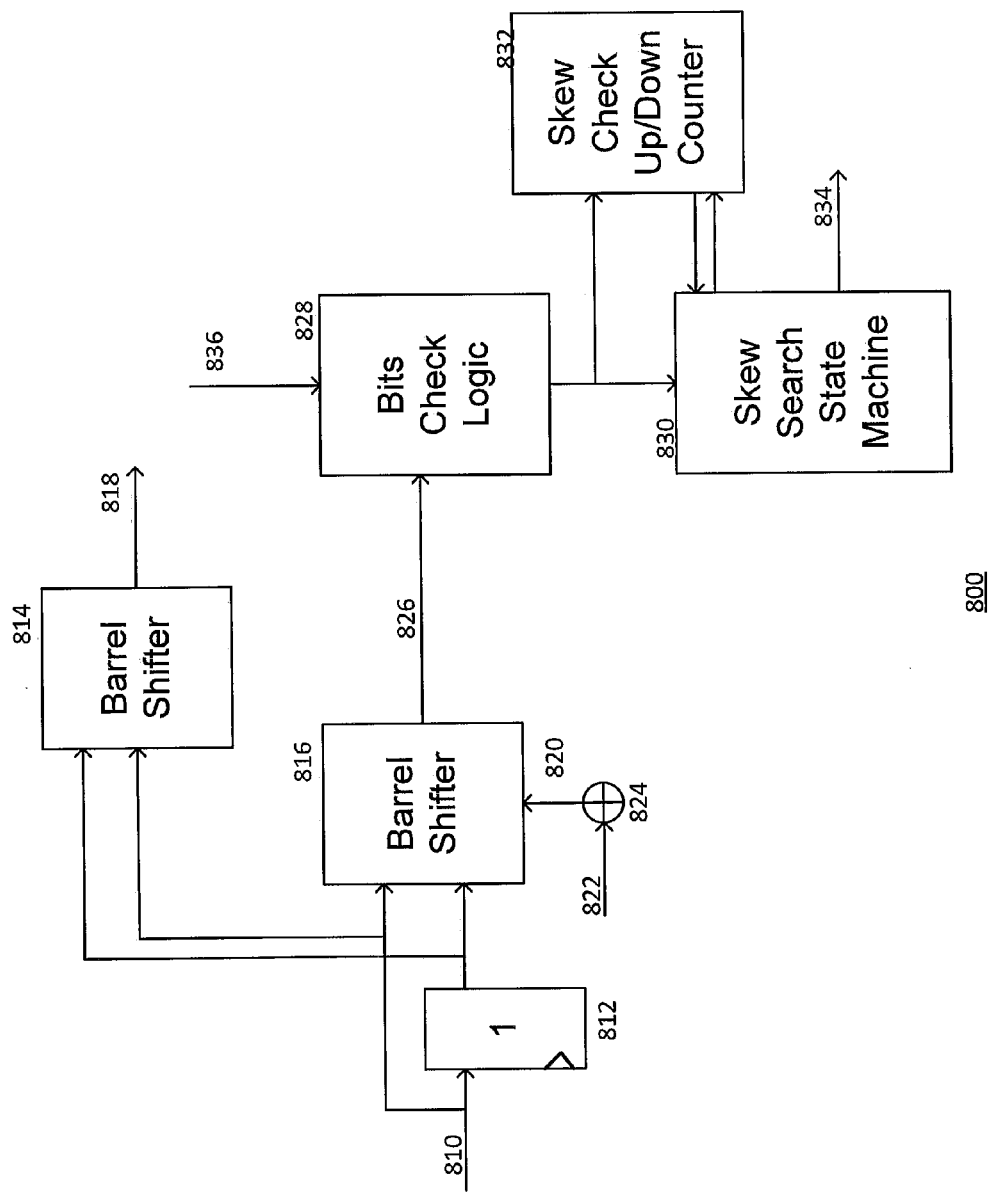
FIG. 8 illustrates an ADC receive data bits deskew circuit according to an embodiment of the present disclosure.

FIG. 8 illustrates an ADC receive data bits deskew circuit 800 according to an embodiment of the present disclosure. ADC receive data bits deskew circuit 800 has a logic structure which can have two hypothesis bits per clock cycle to check for relative bits position vs. the deskew channel bits. A state machine 830 is used to step through plus and minus offset potential skew relative to the deskew channel DSC. A bits check up/down counter is used to improve the ratio of probability of detection to the probability of false alarm. A separate barrel shifter control by an offset is used to output 32 bit data to a descrambler.

In the ADC receive data bits deskew circuit 800, a stream of bits corresponding to the nth bit of the ADC stream is input at 810 to flip flop 812. 32 bits are input directly to barrel shifter 816, and input also through flip flop 812. Each bit stream is also input into Barrel shifter 814, which outputs 32 bits at 818 as the ADC nth bit out to the descrambler.

A 6 bit, nth bit output 748 from the frame sync circuit 746 in FIG. 7 is input to adder 824, and subsequently input to barrel shifter 816. Barrel shifter 816 receives as an input at 820 and outputs 15 bits at to bits logic check circuit 828. Bits logic check circuit 828 also receives a 2 bit input from frame synch outputs at 836, and has outputs connected to skew state machine 830 and skew check up/down counter 832. Skew state machine 830 outputs a 6 bit offset at 834.

The frame search state machine 726 illustrated in FIG. 7 keeps monitoring frame parity bits in the DSC channel to ensure frame alignment. Each of the n skew search state machines, shown by way of example as 830 in FIG. 8, also check for bits alignment. Using the Up/Down counter together with programmable lock detection threshold and lose-lock detection threshold to aid the probability of detection/false alarm. These logic circuits can indicate the over-all state of receiver health.

Figure 9:
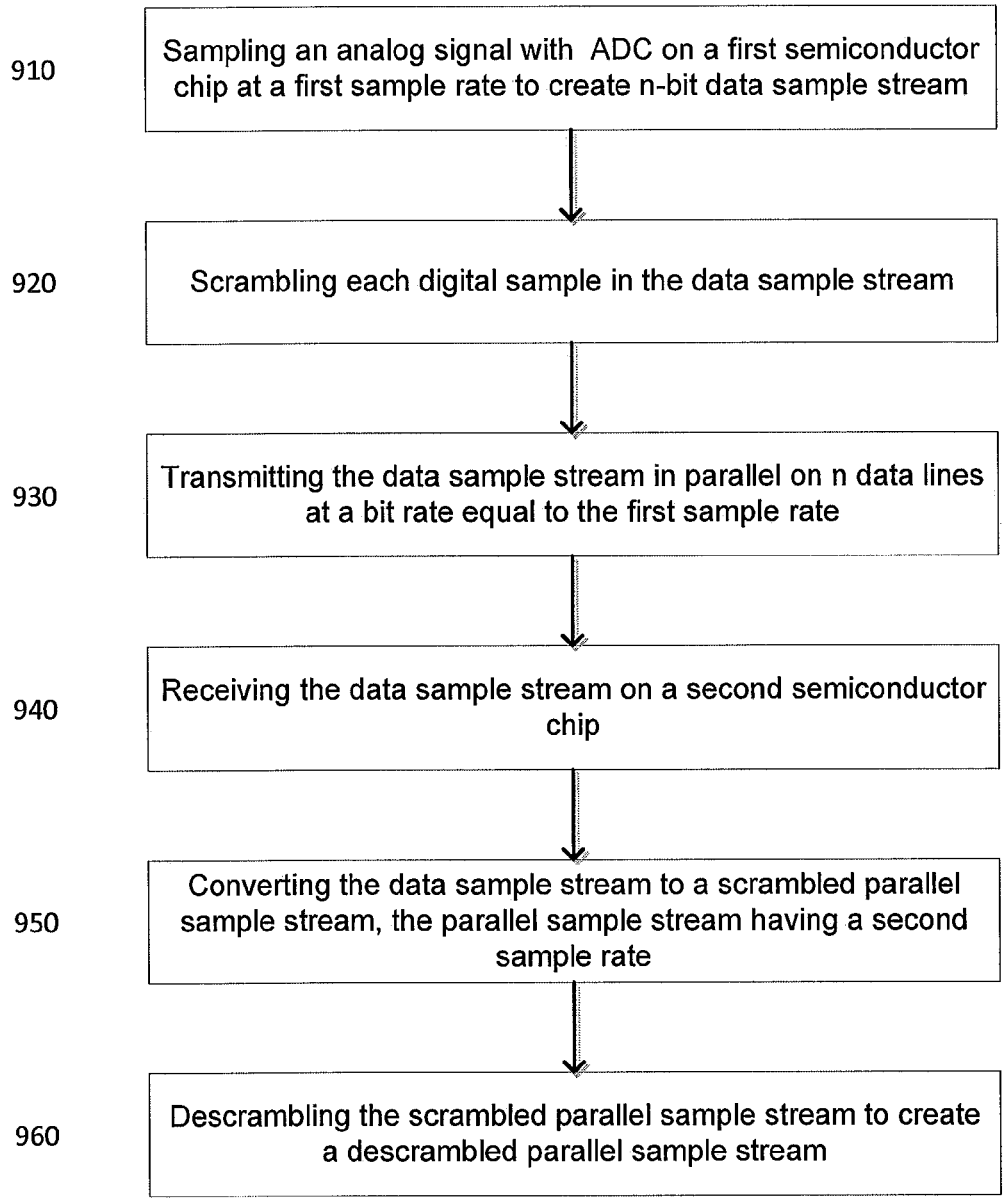
FIG. 9 illustrates a method for taking samples at an ultra high sample rate using an ADC circuit according to an embodiment of the present disclosure.

FIG. 9 illustrates a method for taking samples at an ultra high sample rate using an ADC circuit according to an embodiment of the present disclosure. At 910 a method begins with sampling an analog signal with an ADC on a first semiconductor chip at a first sample rate to create n-bit data sample stream.

In some embodiments, the first sample rate is between one billion samples per second and 10 billion samples per second, and further wherein each sample comprises between 8 bits and 32 bits. At 920 the method continues with scrambling each digital sample in the data sample stream. At 930, the method continues with transmitting the data sample stream in parallel on n data lines at a bit rate equal to the first sample rate. At 940 receiving, on a second semiconductor chip, the data sample stream. At 950 the method continues with converting the data sample stream to a scrambled parallel sample stream, the parallel sample stream having a second sample rate. In some embodiments, the second sample rate is between 1/8 and 1/256 times the first sample rate. At 960 the method continues with descrambling the scrambled parallel sample stream to create a descrambled parallel sample stream.

In embodiments, the method can include taking one bit from each sample and creating a deskew channel, transmitting the deskew channel on a deskew data line, receiving, on the second semiconductor chip, the deskew channel, periodically deskewing the scrambled parallel sample stream using the deskew data line. Transmitting the deskew channel on a deskew data line can include transmitting a first p successive bits from successive samples, transmitting a first parity bit, transmitting a second p successive bits from successive samples, transmitting a second parity bit, transmitting a third p successive bits from successive samples, and transmitting a third parity bit.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A system comprising:
   a first section comprising:
      a digital sampler configured to output samples at a first rate on a plurality of output lines; and
      a set of parallel scramblers connected to the plurality of output lines of the digital sampler, each scrambler having a serial data output; and
   a second section comprising:
      a set of serial data inputs;
      a set of serial-to-parallel converter circuits connected to the serial data inputs and configured to output data at a second rate on a plurality of reduced-speed output lines;
      at least one descrambler having inputs connected to the reduced-speed output lines; and
      a set of parallel outputs configured to output sample data,
   wherein the serial data outputs of the plurality of scramblers are configured to be connected to the set of serial data inputs in the second section by a set of communication pathways clocked at a speed substantially equal to the first rate.

2. The system of claim 1, further comprising:
   a deskew channel circuit in the first section connected to the serial data outputs; and
   a deskew controller in the second section connected to the serial-to-parallel converter circuits, the deskew controller configured to output a deskew signal.

3. The system of claim 2, wherein the deskew channel circuit comprises:
   a first multiplexer having inputs connected to the serial data outputs;
   an odd/even parity generator connected to an output of the first multiplexer;
   a framing controller connected to the first multiplexer and to the odd/even parity generator; and
   a second multiplexer connected to the odd/even parity generator and to the first multiplexer.

4. The system of claim 3, wherein the framing controller comprises a mod-15 counter.

5. The system of claim 3, wherein the deskew channel circuit is configured to interleave first successive bits output by the first multiplexer, a first parity bit, second successive bits output by the first multiplexer, a second parity bit, third successive bits output by the first multiplexer, and a third parity bit.

6. The system of claim 1, wherein:
   the first section comprises an analog-to-digital converter chip; and
   the second section comprises a field programmable gate array.

7. The system of claim 1, wherein each scrambler and descrambler comprises a series of flip-flops and a pair of XOR gates.

8. The system of claim 1, wherein the second rate is between 1/8 and 1/256 times the first rate.

9. The system of claim 8, wherein:
   the first rate is between one billion samples per second and 10 billion samples per second; and
   each sample comprises between 8 bits and 32 bits.

10. The system of claim 1, wherein the communication pathways comprise optical links.

11. The system of claim 1, wherein:
    different scramblers are connected to different output lines of the digital sampler;
    different serial-to-parallel converter circuits are connected to different serial data inputs; and
    each serial-to-parallel converter circuit is configured to receive scrambled data from a different one of the scramblers via the set of communication pathways.

12. A system comprising:
    an analog-to-digital converter (ADC) system chip comprising:
       an ADC having a plurality of digital output bit lines;
       a plurality of scramblers having input lines connected to the digital output bit lines of the ADC, the scramblers having a plurality of scrambled output bit lines;
       a first multiplexer connected to the plurality of scrambled output bit lines;
       an odd/even parity generator connected to an output of the first multiplexer;
       a framing controller connected to the first multiplexer and to the odd/even parity generator; and
       a second multiplexer connected to an output of the odd/even parity generator and to the first multiplexer; and
    a field programmable gate array (FPGA) chip comprising:
       a first clock data recovery (CDR) circuit having an input connected to an output of the second multiplexer;
       a plurality of additional CDR circuits, each additional CDR circuit having an input connected to one of the scrambled output bit lines;

a plurality of serial input-to-parallel output (SIPO) circuits, each SIPO circuit having an input connected to an output of one of the additional CDR circuits;

a deskew controller having a plurality of inputs connected to outputs of the plurality of SIPO circuits; and a plurality of parallel descramblers connected to the outputs of the SIPO circuits.

13. The system of claim 12, wherein the framing controller comprises a mod-15 counter.

14. The system of claim 12, wherein the ADC system chip is configured to interleave first successive bits output by the first multiplexer, a first parity bit, second successive bits output by the first multiplexer, a second parity bit, third successive bits output by the first multiplexer, and a third parity bit.

15. The system of claim 12, wherein the plurality of additional CDR circuits are connected to the scrambled output bit lines using optical links.

16. The system of claim 12, wherein each scrambler and descrambler comprises a series of flip-flops and a pair of XOR gates.

17. A method comprising:

at a first semiconductor chip:

sampling an analog signal with an analog-to-digital converter (ADC) at a first sample rate to create digital samples in a data sample stream, wherein each digital sample has multiple bits;

scrambling the bits in the digital samples to generate multiple serial data outputs; and transmitting the serial data outputs in parallel as a scrambled data sample stream on multiple data lines at a speed substantially equal to the first sample rate; and at a second semiconductor chip:

receiving the scrambled data sample stream over the data lines;

converting the scrambled data sample stream to a scrambled parallel data sample stream, the scrambled parallel data sample stream having a second sample rate lower than the first sample rate; and descrambling the scrambled parallel data sample stream to create a descrambled parallel data sample stream.

18. The method of claim 17, further comprising:

at the first semiconductor chip:

taking one bit from each digital sample and creating a deskew channel; and transmitting the deskew channel on a deskew data line; and at the second semiconductor chip:

receiving the deskew channel over the deskew data line; and deskewing the scrambled parallel data sample stream using the deskew channel.

19. The method of claim 17, wherein the second sample rate is between 1/8 and 1/256 times the first sample rate.

20. The method of claim 19, wherein:

the first sample rate is between one billion samples per second and 10 billion samples per second; and each sample comprises between 8 bits and 32 bits.

21. A method comprising:

at a first semiconductor chip:

sampling an analog signal with an analog-to-digital converter (ADC) at a first sample rate to create digital samples in a data sample stream, wherein each digital sample has multiple bits;

scrambling the bits in the digital samples to generate multiple serial data outputs;

transmitting the serial data outputs in parallel as a scrambled data sample stream on multiple data lines;

taking one bit from each digital sample and creating a deskew channel; and transmitting the deskew channel on a deskew data line; and at a second semiconductor chip:

receiving the scrambled data sample stream over the data lines;

converting the scrambled data sample stream to a scrambled parallel data sample stream, the scrambled parallel data sample stream having a second sample rate lower than the first sample rate;

descrambling the scrambled parallel data sample stream to create a descrambled parallel data sample stream;

receiving the deskew channel over the deskew data line; and deskewing the scrambled parallel data sample stream using the deskew channel;

wherein transmitting the deskew channel on the deskew data line comprises:

transmitting first successive bits from successive digital samples;

transmitting a first parity bit;

transmitting second successive bits from successive digital samples;

transmitting a second parity bit;

transmitting third successive bits from successive digital samples; and transmitting a third parity bit.

* * * * *